United States Patent [19]

Tamura

[11] Patent Number: 4,820,995
[45] Date of Patent: Apr. 11, 1989

[54] TEMPERATURE STABILIZED RF DETECTOR

[75] Inventor: Yoshiharu Tamura, Tokyo, Japan

[73] Assignee: NEC Corporation, Japan

[21] Appl. No.: 193,835

[22] Filed: May 13, 1988

[30] Foreign Application Priority Data

May 15, 1987 [JP] Japan .................................. 62-116766

[51] Int. Cl.⁴ .............................................. H03D 1/10
[52] U.S. Cl. ...................................... 329/204; 329/206; 307/354; 455/337
[58] Field of Search ............... 329/178, 179, 203, 204, 329/205 R, 206; 455/337; 307/354

[56] References Cited

U.S. PATENT DOCUMENTS 4,490,681 12/1984 Turner ............................. 329/204 X Primary Examiner—David Mis
Attorney, Agent, or Firm—Laff, Whitesel, Conte & Saret

[57] ABSTRACT

A temperature stabilized RF detector uses a series circuit including a detecting diode coupled in series with a similarly poled stabilizing diode so that a single current flows in a single direction through both diodes. The temperature related effects of the two diodes are mutually balancing so that temperature variations in the detecting diode do not adversely affect the detection of an RF signal.

12 Claims, 4 Drawing Sheets

TEMPERATURE STABILIZED RF DETECTOR

BACKGROUND OF THE INVENTION

The present invention relates to an RF (radio frequency) detector using a semiconductor diode, and more particularly to a temperature stabilized RF detector.

In the RF detector, it is usual to employ a DC bias current flowing through a detecting diode in order to obtain linear detecting characteristics over the wide dynamic range of RF inputs. Since the forward voltage of the diode depends on its operating temperature, however, such an RF detector has a disadvantage in that the detected output voltage depends on the temperature. This effect is conspicuous specifically for small RF input An RF detector having an improved temperature characteristics for small RF input is described, for example, in a paper entitled "A TEMPERATURE STABILIZED RF DETECTOR WITH EXTENDED DYNAMIC RANGE", by R. J. Turner, 32nd IEEE Vehicular Technology Conference Record, May 23-26, 1982, pp. 231-242. The detail of this RF detector will be descrbed hereinafter. Basically, the Turner's detector cancels the change in detected output voltage due to the temperature variations by connecting a temperature stabilizing diode to the detecting diode so that their temperature environments are identical. As a result, the DC bias variations in the detecting diode due to temperature variations can be compensated. However, since the detecting current flows through only the detecting diode to which the RF signal is applied, the currents flowing through the detecting diode and the temperature stabilizing diode become different from each other. Therefore, the forward voltages across both diodes inevitably become different from each other. Thus, the complete temperature stabilization cannot be attained simply by resorting to the Turner's detector.

SUMMARY OF THE INVENTION

It it an object of the present invention to provide an RF detector circuit which is capable of precisely detecting an RF signal for a wide dynamic range of the RF inputs.

A temperature stabilized RF detector circuit according to the present invention comprises a detecting diode for detecting an RF signal, means for supplying the detecting diode with a DC bias, and a temperatue stabilizing diode. The detecting and temperature stabilizing diodes are arranged so that the same current flows through both diodes, in the same direction.

DETAILED DESCRIPTION OF THE PREFERRED EMBODIMENTS

To facilitate an understanding of the present invention, the RF detector circuit described in the aforementioned aricle by Turner will first be explained referring to FIG. 3.

Figure 3:
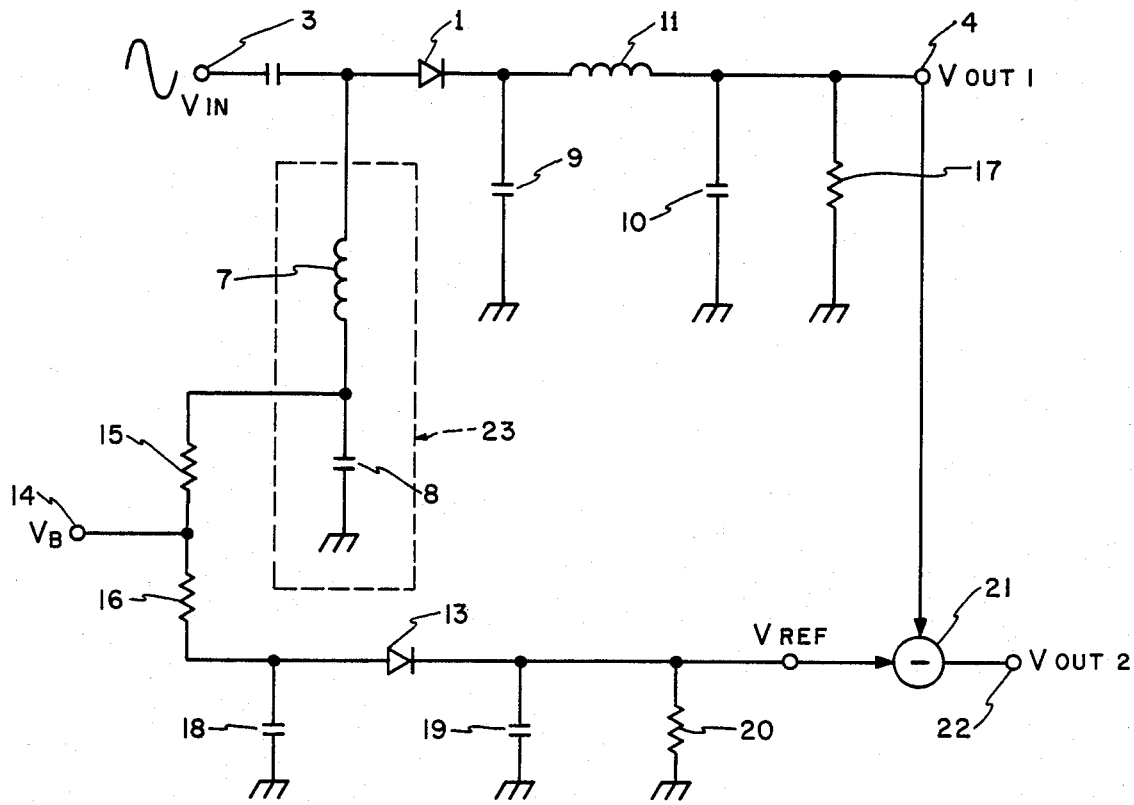
FIG. 3 is a schematic diagram of a prior art RF detector circuit.

In FIG. 3, an RF voltage at an input terminal 3 is detected by a detecting diode 1, smoothed by a filter composed of capacitors 9 and 10 and a choke coil 11, and finally supplied as an output $V_{out1}$ to a terminal 4. The bias voltage $V_B$ is applied to the detecting diode 1 via a resistor 15 and an RF stopping circuit composed of a choke coil 7 and a capacitor 8. A voltage $V_{out2}$ at a terminal 22 is the output of a subtracter 21, which voltage is the difference between the output voltage $V_{out1}$ and the output voltage $V_{REF}$ of a circuit composed of a diode 13, resistors 16 and 20, and capacitors 18 and 19, that is, $$V_{out2} = V_{out1} - V_{REF} \quad (1)$$

Now, the resistance values of the resistors 15, 16, 17 and 20 will be denoted by $R_{15}$, $R_{16}$, $R_{17}$ and $R_{20}$, respectively. The voltage across the resistor 17, that is, the voltage $V_{out1}$ at the terminal 4, is the sum of a DC bias voltage divided by a voltage divider composed of the resistors 15 and 17, and the detected voltage $V_{DET}$, $$V_{out1} = (V_B - V_{D1})(R_{17}/(R_{15}+R_{17})) + V_{DET} \quad (2)$$

where $V_{D1}$ denotes the forward voltage of the diode 1.

On the other hand, the voltage $V_{REF}$ across the resistor 20 is given by, $$V_{REF} = (V_B - V_{D13})(R_{20}/(R_{16}+R_{20})) \quad (3)$$

where $V_{D13}$ denotes the forward voltage of the diode 13. If $R_{15}=R_{16}$ and $R_{17}=R_{20}$, the following expression is obtained from equations (1), (2) and (3), $$V_{OUT2} = V_{OUT1} - V_{REF} = (V_{D1} - V_{D13})(R_{17}/(R_{15}R_{17})) + V_{DET} \quad (4)$$

If the diodes having the same temperature characteristics are used as diodes 1 and 13 in the identical temperature environment, the following relation holds, $$V_{D1} = V_{D13} \quad (5)$$

with the result that $$V_{out2} = V_{DET} \quad (6)$$

Therefore, the use of the diode 13 can eliminate the change in the DC bias due to temperature variations and thus suppress the corresponding change in the final detected voltage.

Figure 4:
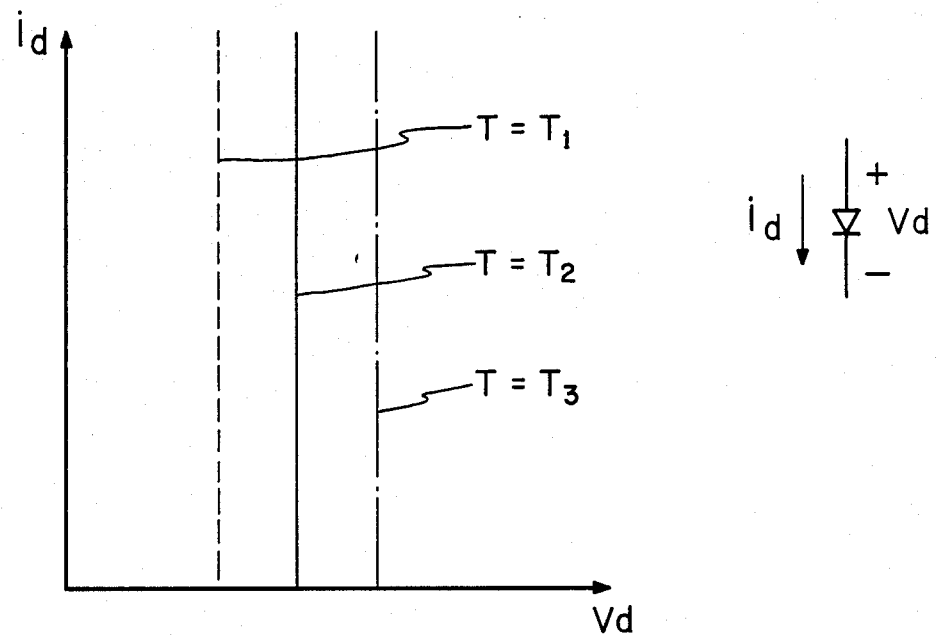
FIG. 4 is a diagram showing the idealized I-V characteristics of a didode at various operating temperatures.
Figure 5:
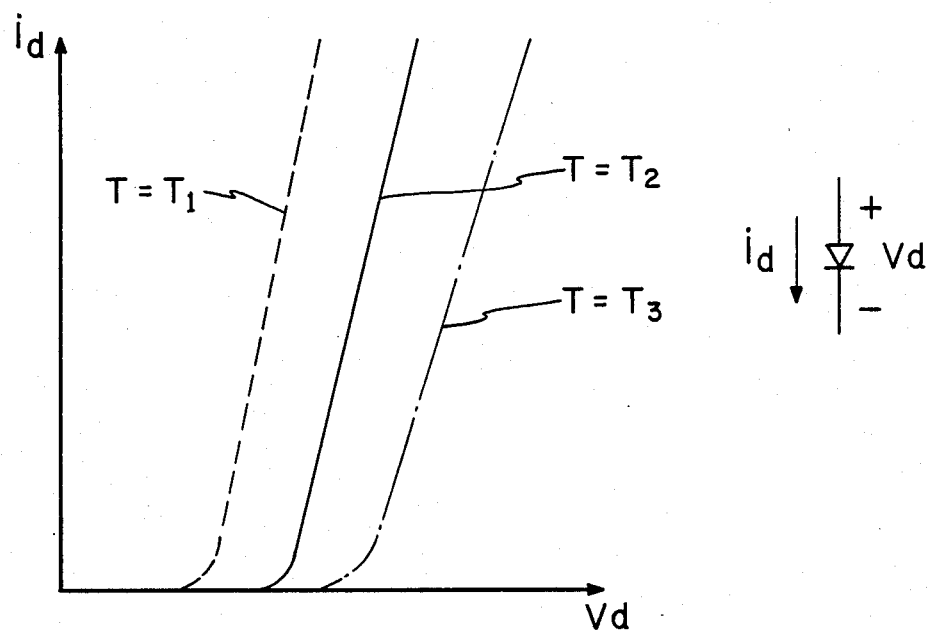
FIG. 5 is a diagram showing the real I-V characteristics of a diode at various operating temperatures.

In the aforementioned detector circuit (FIG. 3) by Turner, it is assumed that the forward voltage of a diode depends only on its operating temperature and not on the current flowing therethrough, as is shown in FIG. 4. Under this assumption, the temperature stabilization can be completely realized by means of the circuit in FIG. 3. However, the real diode does not have the I-V characteristics shown in FIG. 4, but has the characteristics shown in FIG. 5. In other words, the forward voltage $V_d$ of a diode is given by $$V_d = V_d(i, T),$$

where T denotes the operating temperature of the diode.

Assuming that the operating temperature T is constant, a constant current $i_{D13}$ flows through the diode 13 (FIG. 3), which current is equal to the current $i_{D1}$ through the diode 1 if the RF input signal is absent. Otherwise, the detected current flows through the diode 1 in addition to the current $i_{D13}$. That is, $$i_{D1} = i_{D13} + i_{DET} \quad (7)$$

where $i_{DET}$ denotes the DC component of the ripple current produced by the detection. As is obvious from equation (7), $i_{D1} \neq i_{D13}$, so that $$V_d(i_{D1}, T) \neq V_d(i_{D13}, T)$$

Thus, the assumption of equation (5) does not hold, which means that the temperature stabilization is incomplete for the circuit shown in FIG. 3.

If the values of the resistors 15, 16, 17 and 20 are properly selected, the relation $i_{D1} = i_{D13}$ holds only for a certain RF input level. However, it does not hold for other RF input levels, again causing an incomplete temperature stabilization.

Figure 1:
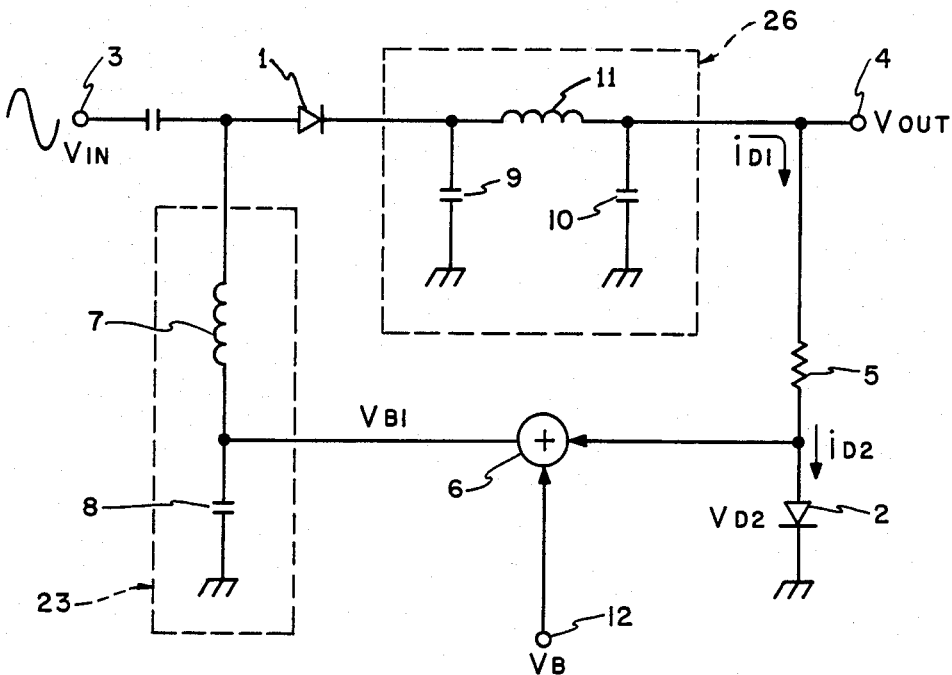
FIG. 1 is a schematic diagram of an RF detector circuit according to the present invention.

Now, the present invention will be explained with reference to FIG. 1. In FIG. 1, an RF detector circuit comprises a detecting diode 1 and a filter 26 composed of capacitors 9 and 10 and a choke coil 11, by which an RF signal applied at a terminal 3 is detected and smoothed to be supplied to a terminal 4. An RF stopping circuit 23 is composed of a choke coil 7 and a capacitor 8. The series connection of a resistor 5 and a compensating diode 2 is connected between the terminal 4 and ground. A bias voltage $V_{B1}$ is produced by summing a voltage at the connection point of the resistor 5 and the diode 2, and a bias voltage $V_B$ applied at a terminal 12. This summing is accomplished by means of an adder 6. This bias voltage $V_{B1}$ is applied to the detecting diode 1 through RF stopping circuit 23.

The detecting diode 1 and the compensating diode 2 have the same polarity with respect to the current loop of the bias voltage $V_{B1}$ applied to the diode 1. Moreover, the same current is made to flow through both diodes. In other words, the current $i_{D1}$ through the diode 1 is always equal to the current $i_{D2}$ through the diode 2. Therefore, if the diodes 1 and 2 are thermally coupled so as to be subjected to the same temperature effect, the forward voltages of the diodes 1 and 2 become $$V_{D1} = V_d(i_{D1}, T) = V_{D2} = V_d(i_{D2}, T)$$

Thus, an output voltage $V_{out}$ at the terminal 4 is given by, $$V_{out} = V_{B1} - V_{D1} + V_{DET}$$

where $V_{DET}$ denotes the detected voltage. Since $$V_{B1} = V_B + V_{D2} = V_B + V_{D1}$$

the output voltage becomes $$V_{out} = V_B + V_{D1} - V_{D1} + V_{DET} = V_B + V_{DET} \quad (8)$$

Consequently, the detected output voltage $V_{out}$ is not affected by the variation in the forward voltage of the diode for any RF input signal level and any operating temperature. The voltage $V_{B1}$ and the value of the resistor 5 are determined so that the linear operation of the diode is assumed and that the dynamic range of the output voltage $V_{out}$ lies in the desired range.

Figure 2:
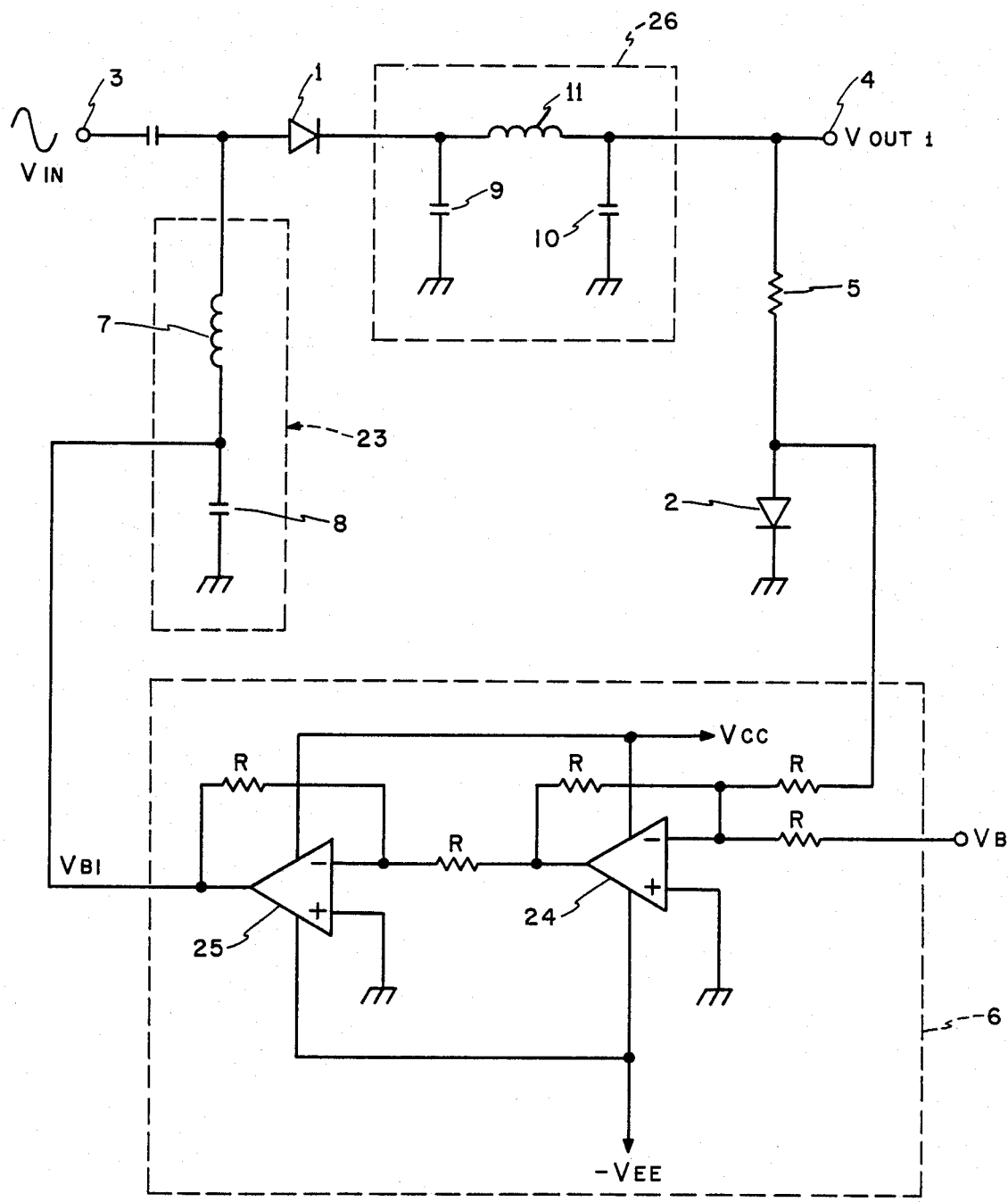
FIG. 2 is a schematic diagram showing the specific circuit of FIG. 1.

In the circuit shown in FIG. 2, the adder 6 in the circuit of FIG. 1 is realized by a circuit using the operational amplifiers. The operational amplifier 24 is a high input-impedance inverting adder, while operational amplifier 25 is a low output-impedance inverter acting as a low-impedance voltage source. If all the values of the resistors determining the gain of the amplifiers 24 and 25 are chosen to be identically R, it is obvious that the result of equation (8) can be obtained. It is preferable that an external circuit connected to the terminal 4 is a voltage-driven circuit having substantially infinite input-impedance. In practice, to the terminal 4 may be connected an external circuit whose input impedance is large enough so that substantially no current flows from the RF detector to the external circuit.

Figure 6A:
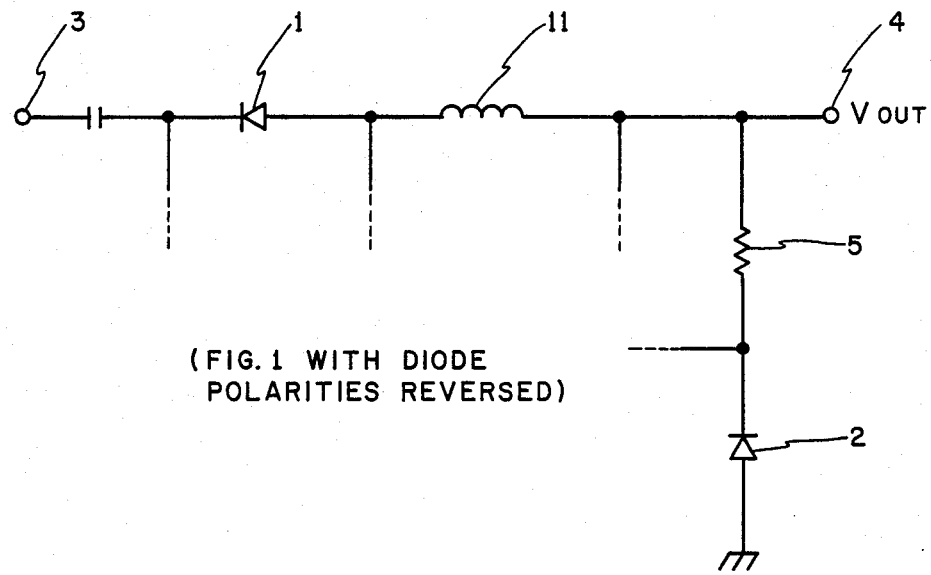
FIGS. 6A, 6B are the same as parts of FIGS. 1 and 2, respectively, with the polarity of the diodes reversed.
Figure 6B:
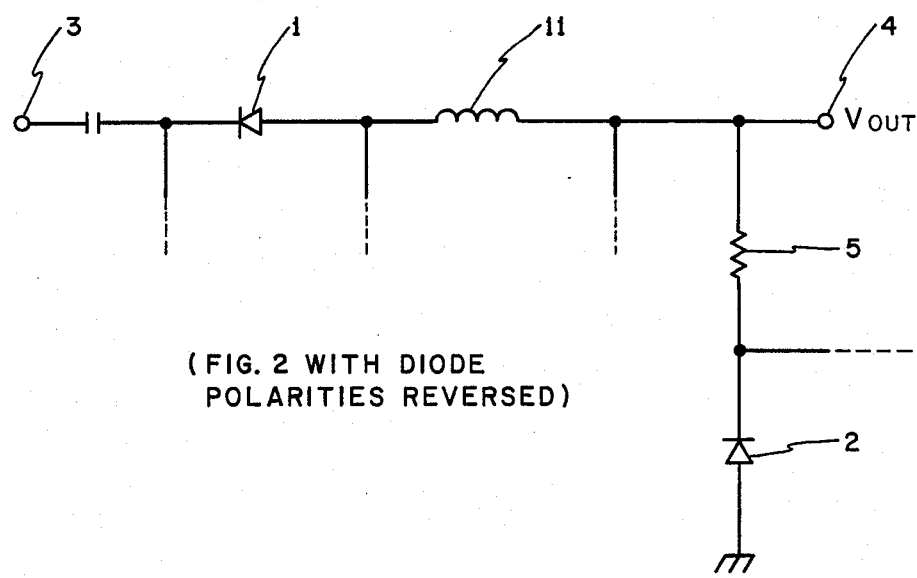

In the above explanation, the RF stopping circuit 23 and the filter 26 for the detected voltage in FIG. 1 are not limited to those circuits which are actually shown. Any circuit can be used if the current flowing through the diodes 1 and 2 are mutually equal with respect to the DC loop of the bias voltage $V_{B1}$. The bias voltage $V_{B1}$ in FIGS. 1 and 2 is assumed to be positive. The polarities of the diodes 1 and 2 should be reversed as shown in FIGS. 6A, 6B, a negative bias voltage is used.

As is explained above, the detector circuit according to the present invention comprises the serial connection of the compensating diode and a resistor connected between the detecting diode and ground so that the same DC current flows through both the detecting diode and the compensating diode. The detector circuit supplies the detecting diode through an RF stopping circuit with a sum of the voltage at the connection point of the serial connection and the predetermined DC voltage. As a result, the final detected voltage is not affected by the diode forward voltage. Accordingly, the effect due to the operating temperature variations is excluded. An extremely precise RF detection can be attained for any RF input signal level.

What is claimed is:

1. A temperature stabilized RF detector circuit comprising:
    a detection diode for detecting an RF input signal;
    a filter coupled to said diode for smoothing the output of said detecting diode;
    a series connection of a compensating diode and a resistor which is connected between said filter and ground, said compensating diode being poled to have the same polarity as said detecting diode, said detecting and compensating diodes being disposed in a manner that their thermal environments are identical with each other; and
    a bias circuit for supplying said detecting diode with a DC bias voltage, said bias circuit being coupled to said detecting and compensating diodes so that the current through said detecting diode is equal to the current through said compensating diode.

2. A detector circuit as claimed in claim 1, wherein said detecting diode has an anode connected to receive said RF input signal.

3. A detector circuit as claimed in claim 1, wherein said detecting diode has a cathode connected to receive said RF input signal.

4. A detector circuit as claimed in claim 1, wherein said bias circuit is connected to a connection point between said compensating diode and said resistor, said detector circuit further comprises:
- an adding circuit having high input and low output impedances for adding a first voltage at said connection point and a second voltage; and
- an RF stopping circuit for stopping an RF component applied to said detecting diode and for applying the output voltage of said adding circuit as said DC bias voltage to said detecting diode.

5. A detector circuit further as claimed in claim 4, wherein said adding circuit comprises:
- first operational amplifier means used as an inverting adder for adding said first voltage and said second voltage to produce an inverted output; and
- second operational amplifier means used as an inverter for inverting said inverted output and for supplying the resultant to said RF stopping circuit.

6. A detector circuit as claimed in claim 5, wherein an RF detected output is obtained at the coupling between said filter and said resistor, said RF detected output being supplied to an external circuit having substantially an infinite input impedance.

7. A temperature stabilized RF detector circuit comprising:
- a detecting diode for detecting an RF signal;
- an RF stopping circuit; and
- a series connection of a compensating diode and a resistor which is connected between said detecting diode and ground so that the same DC current flows in the same direction through said detecting diode and said compensating diode, the sum of the voltage at the connection point of said resistor and said compensating diode and a predetermined DC voltage being applied to said detecting diode via said RF stopping circuit.

8. An RF detector circuit comprising:
- first diode means for detecting an RF signal;
- bias means for supplying said first diode means with a DC bias; and
- second diode means connected to said first diode means and to said bias means so that the same current flowing through said first diode means flows in the same direction through said second diode means.

9. A Rf detector circuit as claimed in claim 8 further comprising:
- a circuit having substantially an infinite input impedance;
- filter means for filtering the detected output detected by said first diode means and for supplying the filtered output to said circuit having substantially an infinite input impedance; and
- resistor means connected between said filter means and said second diode means.

10. An RF detector circuit as claimed in claim 9, wherein said bias means comprises:
- adding means having substantially infinite input impedance coupled to add a DC voltage applied to said second diode means and a predetermined DC voltage; and
- means for stopping an RF component applied to said first diode means and for supplying said first diode means with the output voltage of said adding means as said DC bias.

11. A method for stabilizing variations in a detected output which are due to variations of an operating temperature of a detecting diode, said method comprising the steps of:
- detecting an Rf signal by means of said detecting diode;
- supplying said detecting diode with a DC bias; and
- connecting a stabilizing diode to said detecting diode so that the same current flowing through said detecting diode also flows in the same direction through said stabilizing diode.

12. A method as claimed in claim 11 further comprising the steps of:
- supplying a circuit having substantially infinite input impedance with the detected output detected by said detecting diode after filtering the RF component thereof; and
- applying the filtered detected output to said stabilizing diode through a resistor.

* * * * *